(12) United States Patent
Oh et al.

(10) Patent No.: US 8,354,342 B2
(45) Date of Patent: Jan. 15, 2013

(54) SEMICONDUCTOR DEVICE WITH SIDE-JUNCTION AND METHOD FOR FABRICATING THE SAME

(75) Inventors: Jae-Geun Oh, Gyeonggi-do (KR); Seung-Joon Jeon, Gyeonggi-do (KR); Jin-Ku Lee, Gyeonggi-do (KR); Mi-Ri Lee, Gyeonggi-do (KR); Bong-Seok Jeon, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 43 days.

(21) Appl. No.: 12/939,677

(22) Filed: Nov. 4, 2010

(65) Prior Publication Data
US 2012/0007258 A1 Jan. 12, 2012

(30) Foreign Application Priority Data
Jul. 7, 2010 (KR) .......................... 10-2010-0065264

(51) Int. Cl.
*H01L 23/522* (2006.01)
(52) U.S. Cl. .......... 438/653; 257/E21.294; 257/E23.143
(58) Field of Classification Search .................. 257/776, 257/E21.294, E23.143; 438/653
See application file for complete search history.

(56) References Cited

U.S. PATENT DOCUMENTS

| | | | |
|---|---|---|---|
| 6,605,504 | B1 | 8/2003 | JaiPrakash et al. |
| 2002/0066925 | A1 | 6/2002 | Gruening et al. |
| 2003/0034512 | A1 | 2/2003 | Cappelani et al. |
| 2004/0029346 | A1 | 2/2004 | Jaiprakash et al. |
| 2009/0244954 | A1* | 10/2009 | Cannon et al. ................ 365/149 |

OTHER PUBLICATIONS

Notice of Allowance issued from Korean Intellectual Property Office on Jul. 25, 2011.

* cited by examiner

*Primary Examiner* — Marc Armand
(74) *Attorney, Agent, or Firm* — IP & T Group LLP

(57) ABSTRACT

A method for fabricating a semiconductor device includes forming a plurality of bodies that are each isolated from another by a trench and each include a diffusion barrier region with a sidewall exposed to the trench, forming a doped layer gap-filling the trench, forming a sidewall junction at the exposed sidewall of the diffusion barrier region by annealing the doped layer, and forming a conductive line coupled with the sidewall junction to fill the trench.

15 Claims, 15 Drawing Sheets

SEMICONDUCTOR DEVICE WITH SIDE-JUNCTION AND METHOD FOR FABRICATING THE SAME

CROSS-REFERENCE TO RELATED APPLICATIONS

The present application claims priority of Korean Patent Application No. 10-2010-0065264, filed on Jul. 7, 2010, which is incorporated herein by reference in its entirety.

BACKGROUND OF THE INVENTION

Exemplary embodiments of the present invention relate to a method for fabricating a semiconductor device including a side-junction, and a method for fabricating the semiconductor device.

When cells having a vertical transistor structure employ buried bit lines (BBL), each buried bit line BBL may be adjacent to two cells. For a cell to be driven by a buried bit line BBL, a One-Side-Contact (OSC) process may be performed for forming a contact in an active region while insulating another active region. Hereafter, the OSC process will be simply referred to as a sidewall contact process. In a cell of a vertical transistor structure formed by using the sidewall contact process, each active region includes a body isolated by a trench and a pillar formed over the body. A buried bit line BBL fills a trench between bodies, and a word line (or a vertical gate) is disposed adjacent to the sidewall of a pillar and extended in a direction crossing a buried bit line BBL. The word line forms a channel in a vertical direction.

According to the sidewall contact process, a portion of a sidewall of the body is exposed to couple an active region with a buried bit line BBL. Then, a junction is formed by implanting or diffusing a dopant into the exposed portion of the sidewall of the body. The buried bit line BBL and the body are electrically coupled through the junction. Since the junction is formed on just one sidewall of the body, the junction is referred to as a One-Side Junction (OSJ).

When a diffusion barrier is formed between the buried bit line BBL and the side junction, agglomeration may be caused. To address such a concern, a method of forming a one-side junction by directly forming a doped polysilicon layer without forming a diffusion barrier has been researched.

FIGS. 1A to 1C are cross-sectional views illustrating a conventional method for forming a semiconductor device by using a sidewall contact process.

Referring to FIG. 1A, a plurality of bodies 103 isolated by trenches 102 are formed over a substrate 101. A hard mask pattern 104 is formed over the bodies 103. The hard mask pattern 104 functions as an etch barrier during the formation of active regions.

An insulation layer is formed on both sidewalls of each body 103, the surface of the substrate 101 between the bodies 103, and the surface of the hard mask pattern 104. The insulation layer includes a liner oxide layer 105 and a liner nitride layer 106.

A sidewall contact 107 is formed by removing a portion of the insulation layer. The sidewall contact 107 is a one-side contact which exposes a portion of just one sidewall of a body 103.

Referring to FIG. 1B, a doped polysilicon layer 108 is formed over the substrate structure to gap-fill sidewall contacts 107 and the trenches 102. Here, the doped polysilicon layer 108 is doped with a dopant for forming a sidewall contact. For example, the dopant doping the doped polysilicon layer 108 may be an N-type impurity, such as phosphorus (P).

Referring to FIG. 1C, the doped polysilicon layer 108 is planarized and etched back. As a result, the doped polysilicon layer pattern which is obtained from the planarization and etch-back processes gap-fills a portion of each trench 102 to the degree that the doped polysilicon layer pattern has a height to at least contact the sidewall.

Subsequently, an annealing process 109 is performed. Here, the dopant doping the doped polysilicon layer pattern is diffused into the sidewall of the body 103 exposed by the sidewall so as to form a sidewall junction 110.

However, when the dopant is excessively diffused during the process of forming the doped polysilicon layer pattern, a floating body 111 may be generated to increase a potential and cause a concern with respect to the operation of a cell transistor, such as a threshold voltage drop.

SUMMARY OF THE INVENTION

An exemplary embodiment of the present invention is directed to a semiconductor device which prevents a floating body from being generated due to excessive diffusion of a sidewall junction, and a method for fabricating the semiconductor device.

In accordance with an exemplary embodiment of the present invention, a method for fabricating a semiconductor device includes: forming a plurality of bodies that are each isolated from another by a trench and each include a diffusion barrier region with a sidewall exposed to the trench; forming a doped layer gap-filling the trench; forming a sidewall junction at the exposed sidewall of the diffusion barrier region by annealing the doped layer; and forming a conductive line coupled with the sidewall junction to fill the trench.

In accordance with another exemplary embodiment of the present invention, a method for fabricating a semiconductor device includes: forming a diffusion barrier layer by performing an ion implantation process onto a substrate; forming a plurality of bodies that are each isolated from another by a trench and each include a diffusion barrier region of the diffusion barrier layer with a sidewall of the diffusion barrier region being exposed to the trench by etching the substrate to a depth below the diffusion barrier region; forming an insulation layer through which a sidewall contact is formed to expose the sidewall of the diffusion barrier region; forming a doped layer gap-filling the trench; forming a sidewall junction at the exposed sidewall of the diffusion barrier region by annealing the doped layer; and forming a buried bit line coupled with the sidewall junction to fill the trench.

In accordance with yet another exemplary embodiment of the present invention, a semiconductor device: a plurality of bodies that are each isolated from another by a trench and each include a diffusion barrier region with a sidewall exposed to the trench; an insulation layer through which a sidewall contact is formed to expose the exposed sidewall of the diffusion barrier region; a sidewall junction formed at the exposed sidewall of the diffusion barrier region; a buried bit line coupled with the sidewall junction and arranged to fill the trench; a plurality of pillars formed over the plurality of the bodies, respectively; and a vertical word line extending along a sidewall of each of the pillars in a direction crossing the buried bit line.

DESCRIPTION OF SPECIFIC EMBODIMENTS

Figure 1A:
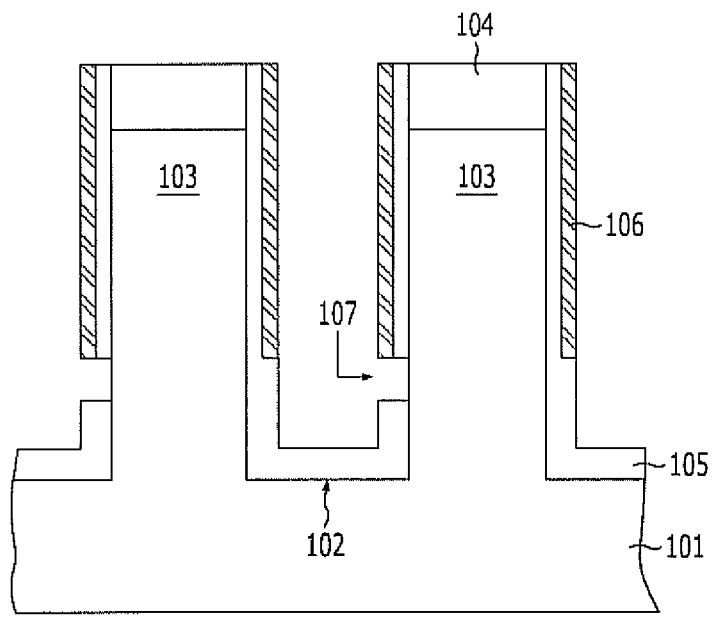
FIGS. 1A to 1C are cross-sectional views illustrating a conventional method for forming a semiconductor device by using a sidewall contact process.
Figure 1B:
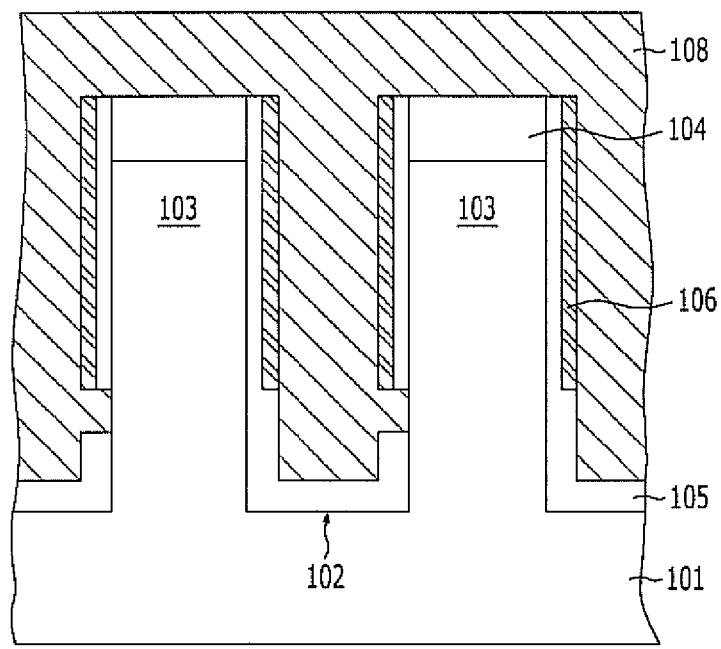
Figure 1C:
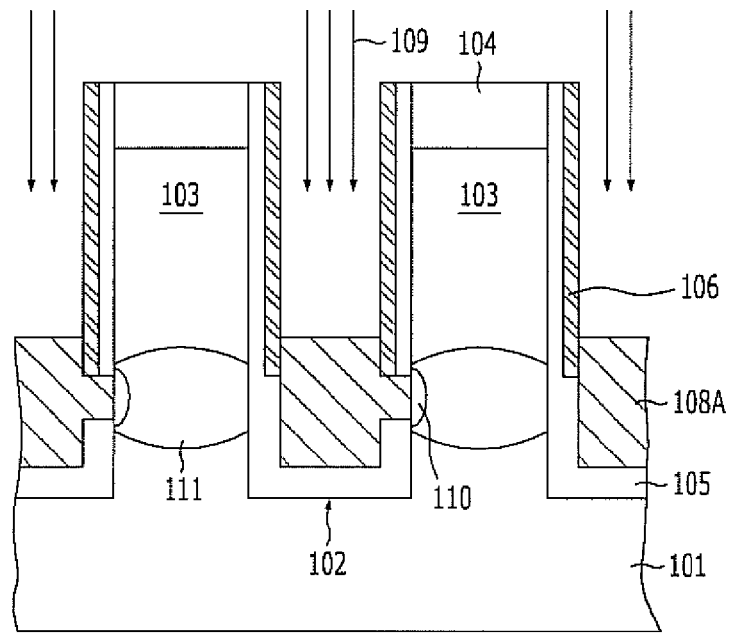

Exemplary embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

The drawings are not necessarily to scale and in some instances, proportions may have been exaggerated in order to clearly illustrate features of the embodiments. When a first layer is referred to as being "on" a second layer or "on" a substrate, it not only refers to a case where the first layer is formed directly on the second layer or the substrate but also a case where a third layer exists between the first layer and the second layer or the substrate.

Figure 2:
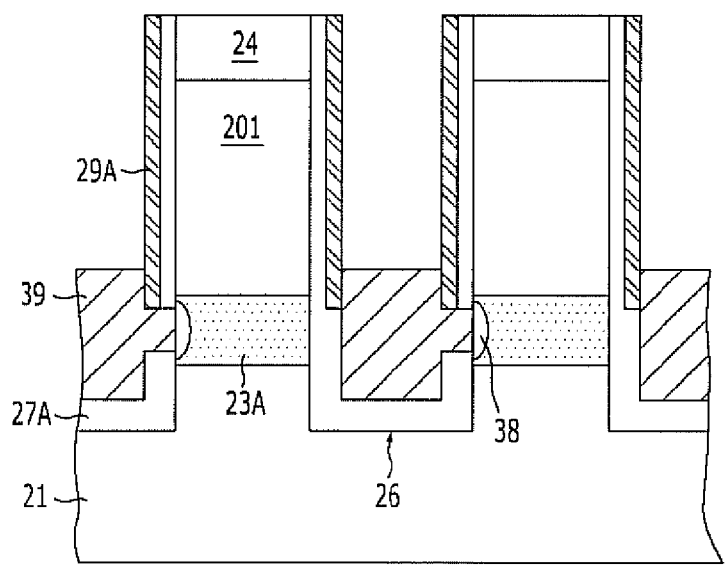
FIG. 2 is a cross-sectional view illustrating a semiconductor device in accordance with an exemplary embodiment of the present invention.

FIG. 2 is a cross-sectional view illustrating a semiconductor device in accordance with an exemplary embodiment of the present invention.

Referring to FIG. 2, a plurality of bodies 201 each include a diffusion barrier region 23A of a diffusion barrier layer and a sidewall exposing the diffusion barrier region 23A. Then, through an insulation layer (for example, 29A and 27A), a sidewall contact exposing a portion of a sidewall and covering the bodies 201 is formed. A sidewall junction 38 is formed in the inside of the diffusion barrier region 23A of the exposed portion of the sidewall. Subsequently, a conductive line coupled with the sidewall junction 38 is formed between the plurality of the bodies 201. The conductive line includes a buried bit line 39. The buried bit line 39 may be a metal bit line formed of a metal layer.

Here, the plurality of the bodies 201 isolated by trenches 26 are formed over a substrate 21. According to an example, the substrate 21 includes a silicon substrate. The plurality of the bodies 201 are formed by etching the substrate 21. When the substrate 21 includes a silicon substrate, the plurality of the bodies 201 may include silicon bodies as well. The plurality of the bodies 201 are extended from the surface of the substrate 21 in a vertical direction. Each of the plurality of the bodies 201 is a region where a channel region, a source region and a drain region of a vertical transistor is formed. Each body 201 includes two sidewalls. The body 201 is referred to as an active body.

A hard mask pattern 24 is formed in the upper portion of the body 201. The hard mask pattern 24 functions as an etch barrier when the body 201 is formed. The hard mask pattern 24 includes a dielectric material layer such as an oxide layer and a nitride layer. According to an example, a nitride layer such as a silicon nitride layer is used as the hard mask pattern 24.

An insulation layer (for example, 29A and 27A) is formed on both sidewalls of the body 201, the surface of a trench 26 between bodies 201, and the surface of the hard mask pattern 24. The insulation layer according to an example includes a liner oxide layer pattern 27A and a liner nitride layer pattern 29A. The liner oxide layer pattern 27A is formed on both sidewalls of the body 201 and the surface of the trench 26. The liner nitride layer pattern 29A is formed on the surface of a portion of the liner oxide layer pattern 27A.

A sidewall contact ('35' in FIG. 4K) is formed by removing a portion of the insulation layer (29A and 27A). The sidewall contact 35 is a one-side contact which selectively exposes a portion of just one sidewall of the body 201. The sidewall contact 35 includes a linear opening which has a shape of line extended along the sidewall of the body 201.

The above-described insulation layer (29A and 27A) provides the sidewall contact 35 which exposes a portion of the sidewall of the body 201. A method for forming the sidewall contact 35 will be described later on with reference to FIGS. 4A to 4K.

Referring to FIG. 2, a sidewall junction 38 is formed in the inside of the diffusion barrier region 23A. With the diffusion barrier region 23A, the sidewall junction 38 is prevented from being excessively diffused.

The diffusion barrier region 23A includes an interstitial impurity such as carbon. The sidewall junction 38 may include phosphorus (P).

FIGS. 3A to 3G are cross-sectional views describing a method for forming the semiconductor device shown in FIG. 2.

Figure 3A:
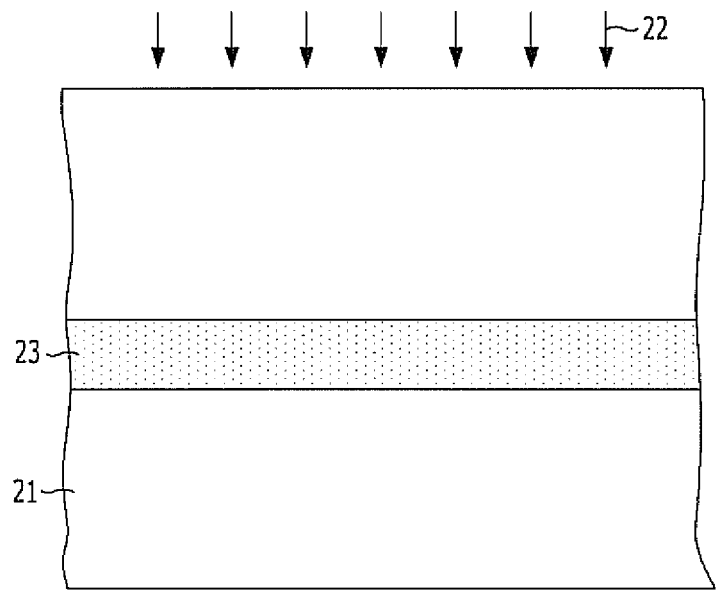
FIGS. 3A to 3G are cross-sectional views describing a method for forming the semiconductor device shown in FIG. 2.

Referring to FIG. 3A, a first impurity is ion-implanted into a substrate 21. The substrate 21 includes a silicon substrate. A first impurity is implanted into a region reserved for a junction through ion implantation 22 to form a diffusion barrier layer 23.

The ion implantation is performed using carbon as the first impurity. Since the substrate 21 is a silicon substrate, carbon becomes an interstitial impurity within the substrate 21. When the dopant for doping a doped polysilicon layer to be formed later in the semiconductor device fabrication process is phosphorus (P), the phosphorus (P) is diffused through interstitial sites. Here, if carbon is already implanted and diffused into the interstitial sites in, for example, the diffusion barrier layer 23, the excessive diffusion of the phosphorus (P) may be prevented. Meanwhile, carbon may have substantially no effect on the conductivity of a sidewall junction.

When carbon is ion-implanted, the diffusion barrier region 23 becomes silicon carbide (SiC).

Figure 3B:
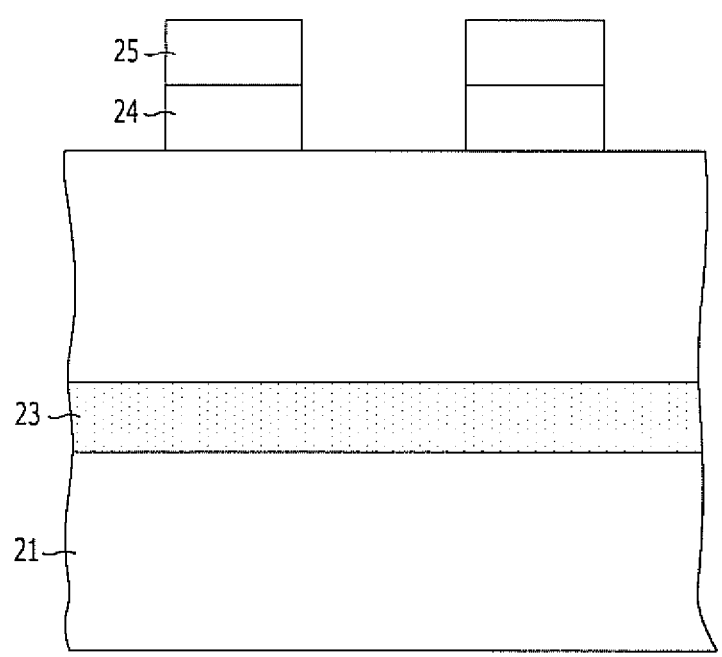

Referring to FIG. 3B, a hard mask pattern 24 is formed over the substrate 21. Here, the hard mask pattern 24 is formed by forming a hard mask layer and then etching the hard mask layer using a photoresist pattern 25 as an each barrier. The photoresist pattern 25 is a line-and-space pattern and it may be also called a buried bit line (BBL) mask. The hard mask pattern 24 may be formed of an oxide layer, a nitride layer, or stacked layers of the two. According to an example, a nitride layer such as a silicon nitride is used as the hard mask pattern 24.

Figure 3C:
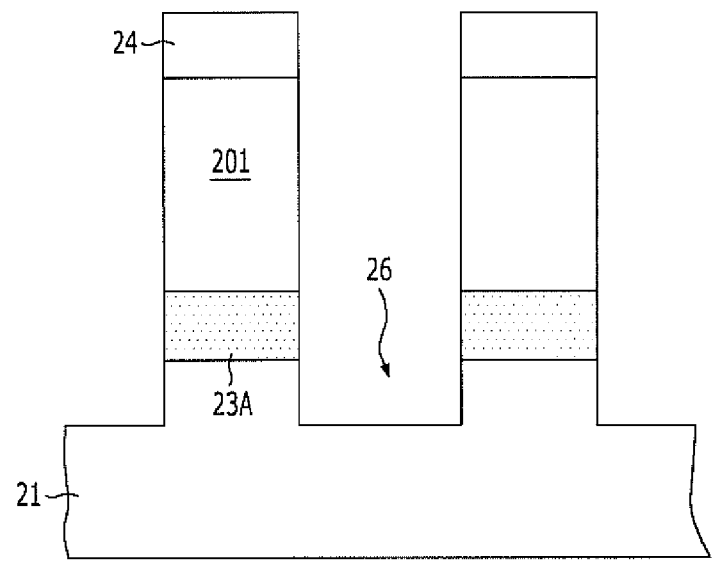

Referring to FIG. 3C, the photoresist pattern 25 is stripped and a plurality of trenches 26 are formed by using the hard mask pattern 24 as an etch barrier and etching the substrate 21 to a desired depth. Due to the plurality of the trenches 26, a plurality of bodies 201 are formed over the substrate 21. The plurality of the bodies 201 are extended from the surface of the substrate 21 in a vertical direction. Each body 201 has two sidewalls. In a vertical cell structure, a body 201 is an active region where a channel region, a source region, and a drain region of a transistor are formed.

The sidewalls of the body 201 may have a vertical profile as shown. The etch process for forming the plurality of bodies 201 and the plurality of the trenches 26 may be a dry etch process using plasma.

As described above, when the plurality of the bodies 201 are formed by etching the substrate 21, each of the plurality of the bodies 201 has a sidewall which exposes a diffusion barrier region 23A. Since the substrate 21 is a silicon substrate, the plurality of the bodies 201 may be referred to as silicon bodies.

Figure 3D:
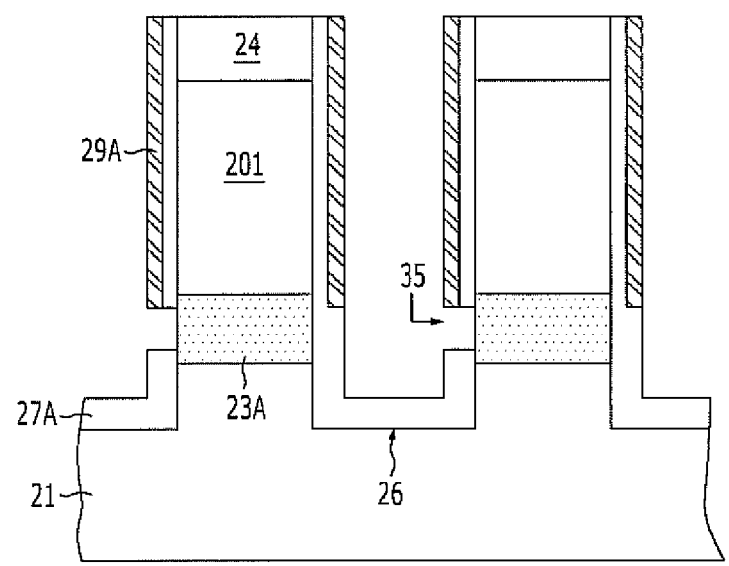

Referring to FIG. 3D, a sidewall contact 35 is formed to expose a portion of a sidewall of a body 201, that is, a portion of the diffusion barrier region 23A.

The sidewall contact 35 is formed of an insulation layer that includes a liner oxide layer pattern 27A and a liner nitride layer pattern 29A. The liner oxide layer pattern 27A is formed on both is sidewalls of the body 201 and the surface of the substrate 21. The liner nitride layer pattern 29A is formed on the surface of a portion of the liner oxide layer pattern 27A. The sidewall contact 35 is formed by removing a portion of the insulation layer. The sidewall contact 35 is a one-side contact which selectively exposes a portion of a sidewall of the body 201. The sidewall contact 35 includes a linear opening which is formed in the shape of line.

The sidewall contact 35 exposes a portion of a sidewall of the body 201 (for example, the diffusion barrier region 23A) at a region reserved for a junction through the insulation layer. A method for forming the sidewall contact 35 will be described in detail later with reference to FIGS. 4A to 4K.

Figure 3E:
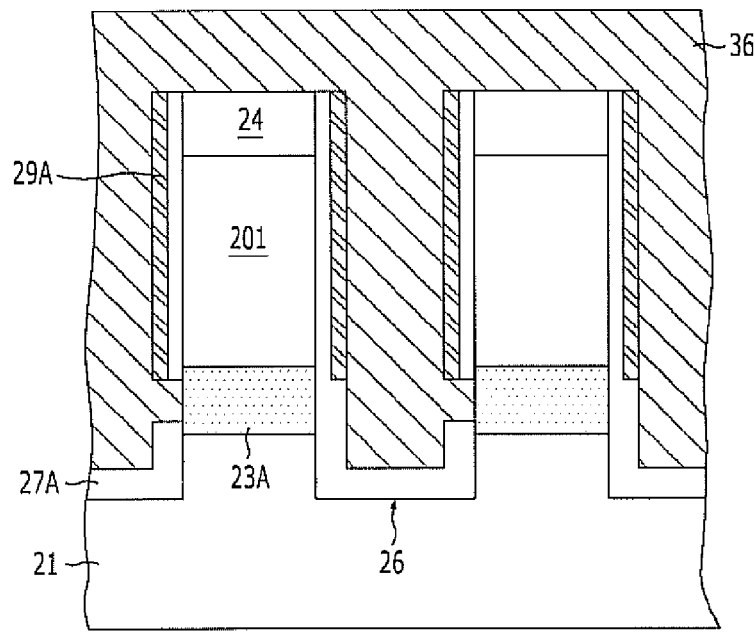

Referring to FIG. 3E, a doped layer is formed to gap-fill the plurality of the trenches 26 between the plurality of the bodies 201. The doped layer includes an impurity for forming a junction implanted therein. The doped layer may include a doped polysilicon layer 36. When the doped polysilicon layer 36 has excellent step coverage, it may gap-fill the plurality of the trenches 26 without voids. Therefore, the doped polysilicon layer 36 used in forming a junction has excellent dose uniformity, where the doped polysilicon layer 36 is doped with a dopant for forming a junction. The dopant for the doped polysilicon layer 36 may be an N-type impurity such as phosphorus (P). The doped polysilicon layer 36 may be formed through a Chemical Vapor Deposition (CVD) method. The dopant doping the doped polysilicon layer 36 includes a dose ranging from approximately $1 \times 10^{15}$ to approximately $1 \times 10^{17}$ atoms/cm$^2$. While the doped polysilicon layer 36 is illustrated as an example, another material doped with an impurity for forming a junction may be used according to another example. For instance, an oxide layer such as phosphor silicate glass (PSG) may be used.

Figure 3F:
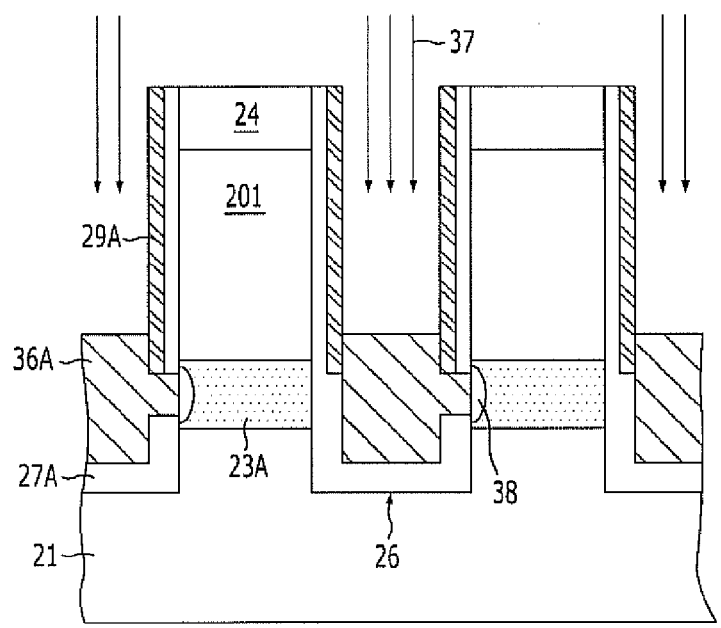

Referring to FIG. 3F, the doped polysilicon layer 36 is planarized and etched back. The doped polysilicon layer 36 acquired after the planarization and etch-back processes is referred to as a doped polysilicon layer pattern 36A, hereafter. As a result, the doped polysilicon layer pattern 36A is formed to gap-fill a portion of each trench 26, where the doped polysilicon layer pattern 36A has a sufficient height to cover the opening on a sidewall of the body 201 for the sidewall contact 35. As described above, the dopant may be prevented from being diffused into the regions other than the sidewall contact during a subsequent annealing process when the planarization and etch-back processes are performed and the height of the doped polysilicon layer pattern 36A is decreased.

Subsequently, an annealing process 37 is performed. Here, the dopant doping the doped polysilicon layer pattern 36A is diffused into the diffusion barrier region 23A which is exposed by the sidewall contact 35 so as to form a sidewall junction 38. When the dopant doping the doped polysilicon layer pattern 36A is an N-type impurity, the sidewall junction 38 becomes an N-type junction.

The annealing process 37 may be a furnace annealing process, a rapid thermal annealing process or a combination of both. The annealing process 37 may be performed at a temperature ranging from approximately 750° to approximately 1200° C. According to an example, the sidewall junction 38 has a doping concentration of approximately at least $1 \times 10^{20}$ atoms/cm$^3$.

As described above, since the sidewall junction 38 is formed by forming the doped polysilicon layer pattern 36A and performing a thermal diffusion through the annealing process 37, the depth of the sidewall junction 38 may be controlled to be shallow and the concentration of the dopant may be controlled easily.

The carbon implanted into the diffusion barrier region 23A may suppress the dopant (for example, N-type impurity such as phosphorus) of the sidewall junction 38 from being diffused excessively during the annealing process 37. As a result, generation of floating bodies may be prevented/reduced. Such a structure that suppresses the excessive diffusion of the sidewall junction 38 is referred to as a body-tied structure.

Figure 3G:
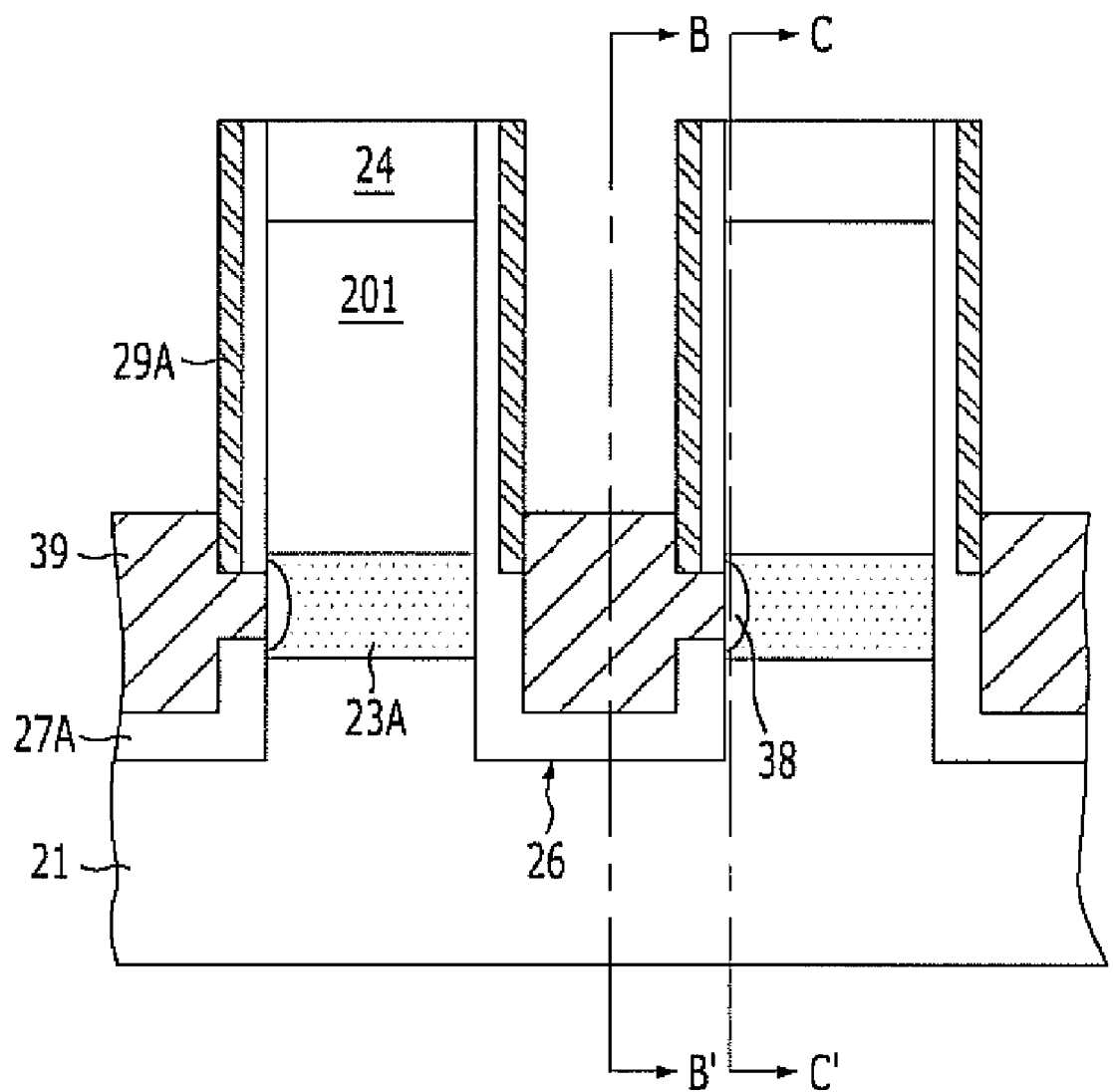

Referring to FIG. 3G, the doped polysilicon layer pattern 36A is removed. Here, the doped polysilicon layer pattern 36A may be removed through a wet etch process or a dry etch process. In case of the dry etch process, chemical compounds based on hydrogen bromide (HBr) or chlorine (Cl$_2$) are used, where oxygen (O$_2$), nitrogen (N$_2$), helium (He) or argon (Ar) are added. In case of the wet etch process, a cleaning solution having a high selectivity between a nitride layer and an oxygen layer is used.

Subsequently, a conductive line electrically connected to the sidewall junction 38, for example, a buried bit line 39, is formed as follows.

First, a bit line conductive layer (for example, 39) is formed over the substrate structure to gap-fill the plurality of the trenches 26. The bit line conductive layer may be a metal layer such as a titanium nitride layer (TiN), a tungsten (W) layer, or stacked layers of both. When the bit line conductive layer is a metal layer, an Ohmic contact is needed between the sidewall junction 38 and the metal layer. Here, the sidewall junction 38 may be formed of silicon and the Ohmic contact may include a metal silicide such as titanium silicide.

Subsequently, a planarization process and an etch-back process are sequentially performed to remove a portion of the bit line conductive layer. As a result of the planarization process and the etch-back process, the buried bit line 39 electrically connected to the sidewall junction 38 is formed. The buried bit line 39 is a metallic bit line formed of the metal layer.

FIGS. 4A to 4K are cross-sectional views illustrating a method of forming the sidewall contact in accordance with an exemplary embodiment of the present invention. The drawings illustrate how the sidewall contact is formed after the process of FIG. 3C.

Figure 4A:
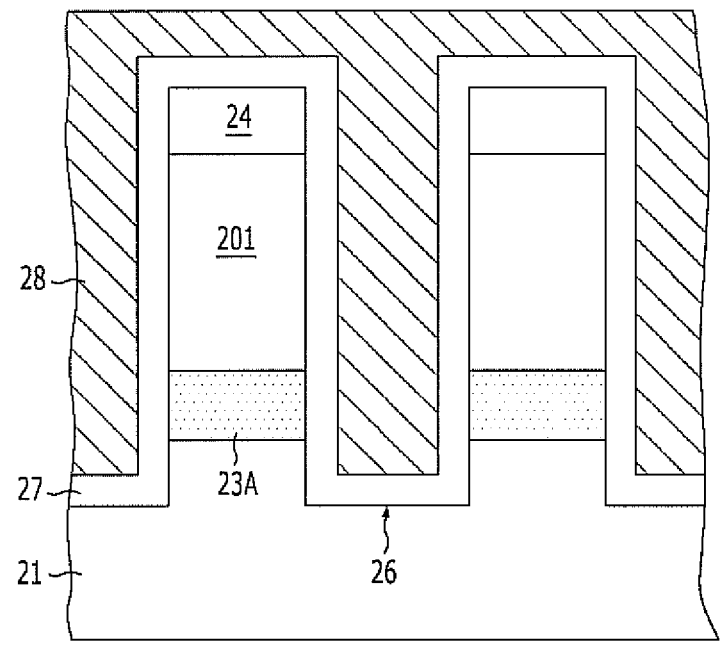
FIGS. 4A to 4K are cross-sectional views illustrating a method of forming a sidewall contact in accordance with an exemplary embodiment of the present invention.

Referring to FIG. 4A, a liner oxide layer 27 is formed as an insulation layer over the substrate structure including the plurality of the bodies 201. The liner oxide layer 27 may include an oxide layer such as a silicon oxide layer.

A first gap-fill layer 28 gap-filling the plurality of the trenches 26 is formed. The first gap-fill layer 28 may be polysilicon layer or amorphous silicon.

Figure 4B:
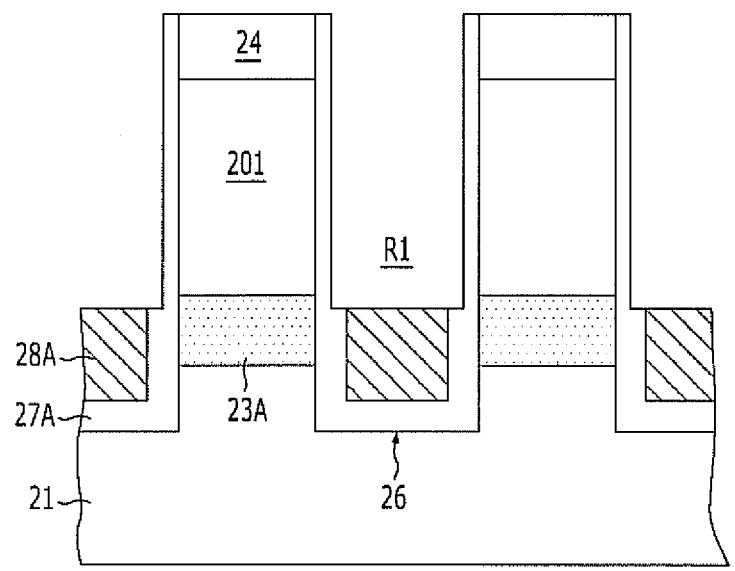

Referring to FIG. 4B, the first gap-fill layer 28 is planarized until the surface of the hard mask pattern 24 is exposed. The planarization of the first gap-fill layer 28 may be performed through a Chemical Mechanical Polishing (CMP) process. Subsequently, an etch-back process is performed. The first gap-fill layer 28 acquired after the etch-back process is referred to as a first gap-fill layer pattern 28A. After the etch-back process, the first gap-fill layer pattern 28A forms a part of a first recess R1. During the CMP process, the liner oxide layer 27 over the hard mask pattern 24 may be polished, where the liner oxide layer pattern 27A may remain covering both sidewalls of each trench 26 and the hard mask pattern 24. The liner oxide layer pattern 27A covers the bottom of the trench 26 as well.

Subsequently, the liner oxide layer pattern 27A is thinned by performing a wet etch process.

Figure 4C:
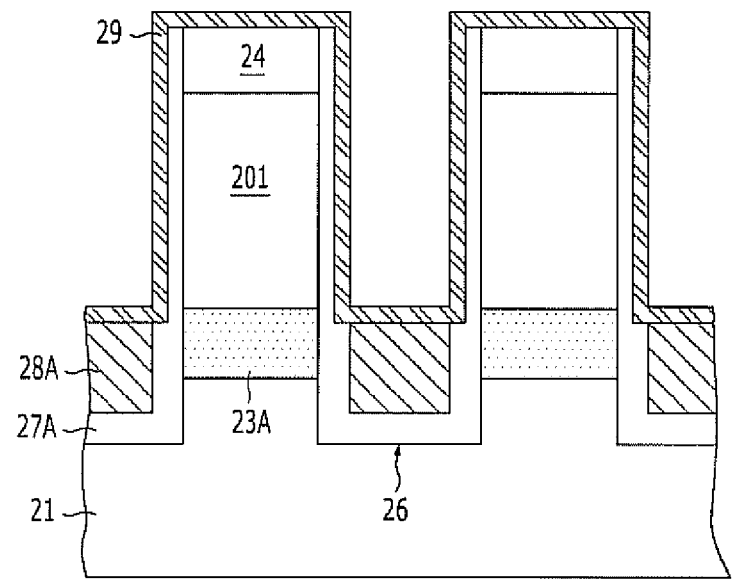

Referring to FIG. 4C, a liner nitride layer 29 is formed of an insulation layer over the resulting substrate structure including the first gap-fill layer pattern 28A. The liner nitride layer 29 may be a nitride layer such as a silicon nitride layer.

Figure 4D:
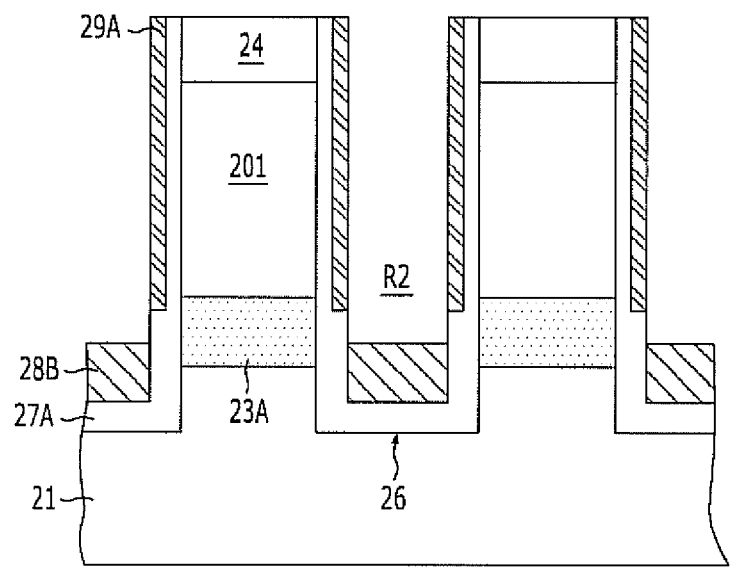

Referring to FIG. 4D, the liner nitride layer 29 is etched. As a result, a liner nitride layer pattern 29A is formed. Subsequently, the first gap-fill layer pattern 28A is recessed to a desired depth by using the liner nitride layer pattern 29A as an etch barrier. As a result, a second recess R2 is formed. The first gap-fill layer pattern forming a part of the second recess R2 is referred to as a first gap-fill layer pattern 28B forming a second recess.

Figure 4E:
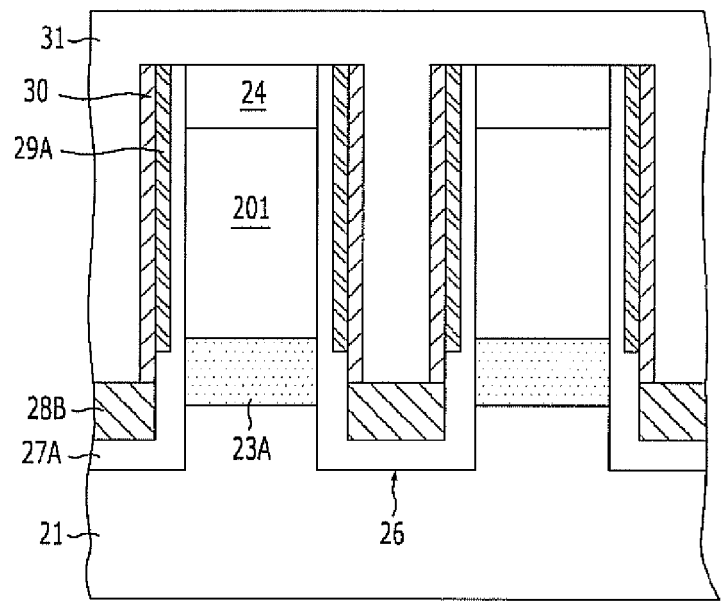

Referring to FIG. 4E, a metal nitride layer for forming spacers 30 is conformally formed over the resulting substrate structure including the second recess R2. Subsequently, spacers 30 are formed by performing a spacer etch process on the metal nitride layer. The spacers 30 are formed on both sidewalls of each body 201, that is, on both sidewalls of the second recess R2. The spacers 30 may be formed of titanium nitride (TiN).

A second gap-fill layer 31 gap-filling the second recess R2 with the spacers 30 formed therein is formed. The second gap-fill layer 31 may be an oxide layer or a spin-on dielectric (SOD) layer.

Figure 4F:
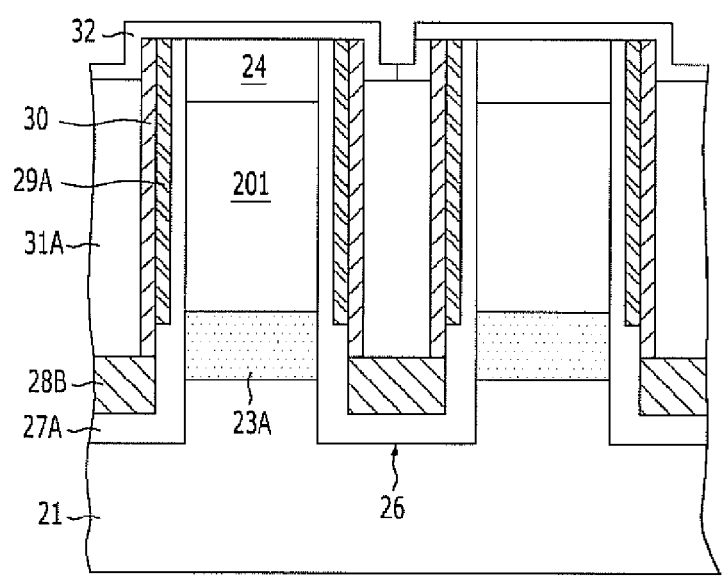

Referring to FIG. 4F, the second gap-fill layer 31 is planarized and etched back. The second gap-fill layer 31 acquired after the planarization and etch-back processes is referred to as a second gap-fill layer pattern 31A.

Subsequently, an etch barrier 32 is formed over the resulting substrate structure including the second gap-fill layer pattern 31A. The etch barrier 32 may be an undoped polysilicon layer.

Figure 4G:
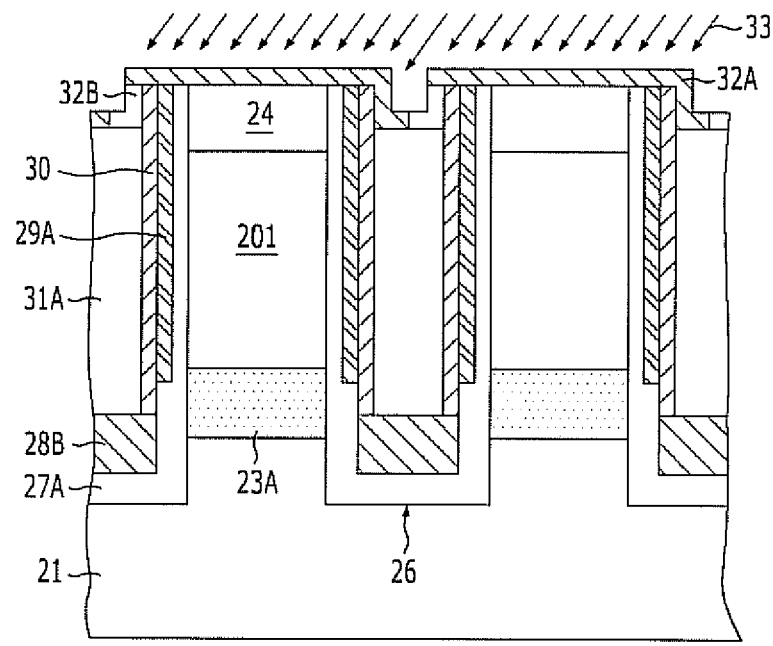

Referring to FIG. 4G, a tilt ion implantation process 33 is performed. The tilt ion implantation process 33 is a process of ion-implanting a dopant at a desired slanted angle. The dopant is ion-implanted into a portion of the etch barrier 32.

The tilt ion implantation process 33 is performed at a desired angle, which ranges from approximately 5° to approximately 30°. Here, a shadow is formed by the hard mask pattern 24 in implanting ion beams. As a result, although a portion of the etch barrier 32 becomes doped, the remainder of the etch barriers remains undoped. According to an example, the dopant ion-implanted is a P-type dopant, e.g., boron, and a dopant source for ion-implanting boron is $BF_2$. As a result, a portion of the etch barrier 32 adjacent to the left side of the hard mask pattern 24 remains undoped.

Due to the tilt ion implantation process 33 of the dopant, a portion of the etch barrier 32 formed over the hard mask pattern 24 and a portion adjacent to the right side of the hard mask pattern 24 is referred to as a doped etch barrier 32A. The other portion of the etch barrier layer 32 which is not doped with the dopant is referred to as an undoped etch barrier 32B.

Figure 4H:
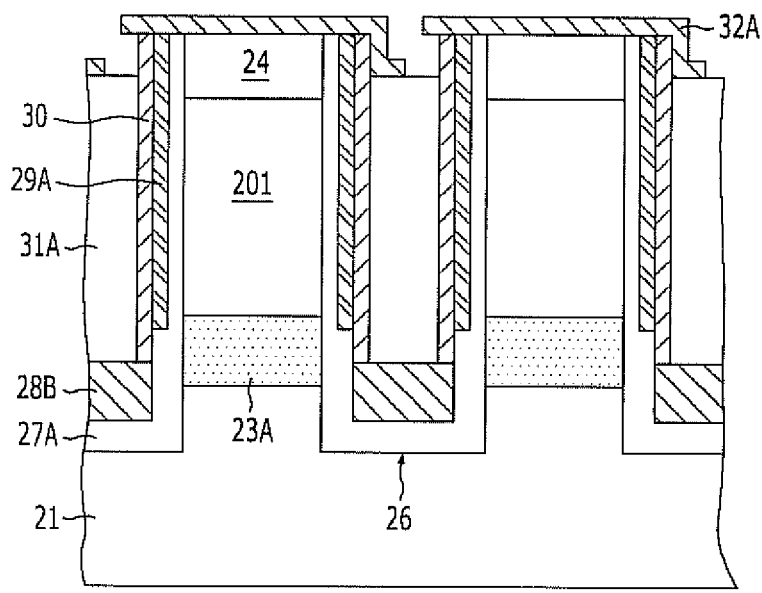

Referring to FIG. 4H, the undoped etch barrier 32B is removed. Here, the polysilicon layer, which is used as the etch barrier, has different etch rates according to whether or not it is doped with the dopant. In particular, the undoped polysilicon layer into which the dopant is not ion-implanted is wet-etched rapidly. Therefore, the undoped polysilicon layer is selectively etched using a chemical having a high selectivity which is capable of wet-etching, for example, the undoped polysilicon layer but not the doped polysilicon layer. The undoped etch barrier 32B is removed through the wet-etch process or a wet cleaning process.

After the undoped etch barrier 32B is removed, only the doped etch barrier 32A remains.

Figure 4I:
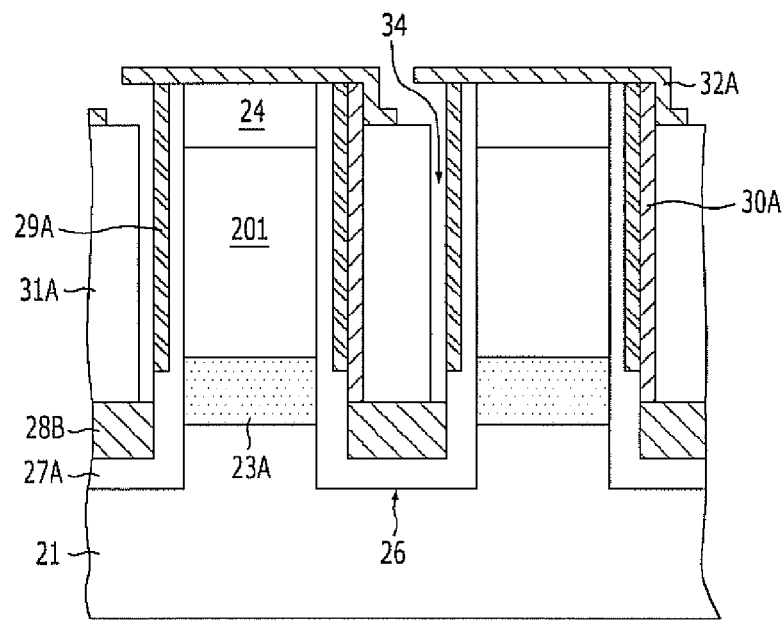

Referring to FIG. 4I, just one of the spacers 30 is removed through a wet-etch process. Accordingly, a spacer referred to as a first spacer 30A remains.

Figure 4J:
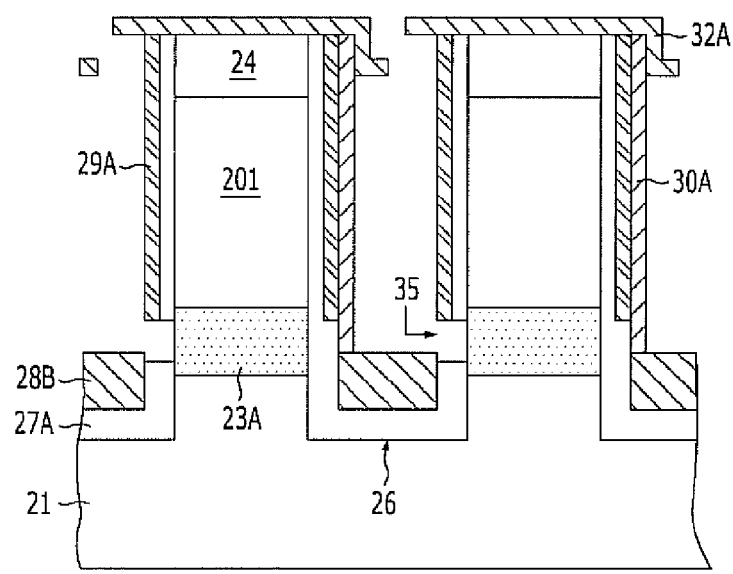

Referring to FIG. 4J, a cleaning process is performed to expose a portion of a sidewall of each body 201.

The cleaning process may be a wet cleaning process. The wet cleaning process may be performed using hydrogen fluoride (HF) or a buffered oxide etchant (BOE). With the wet cleaning process, a portion of the liner oxide layer pattern 27A is removed so as to form a sidewall contact 35. When the sidewall contact 35 is formed, the second gap-fill layer pattern 31A is removed as well.

As described above, the hard mask pattern 24, the liner oxide layer pattern 27A, and the liner nitride layer pattern 29A are collectively referred to as an 'insulation layer.' Here, the insulation layer provides the sidewall contact 35 which exposes a portion of a sidewall of the body 201.

Figure 4K:
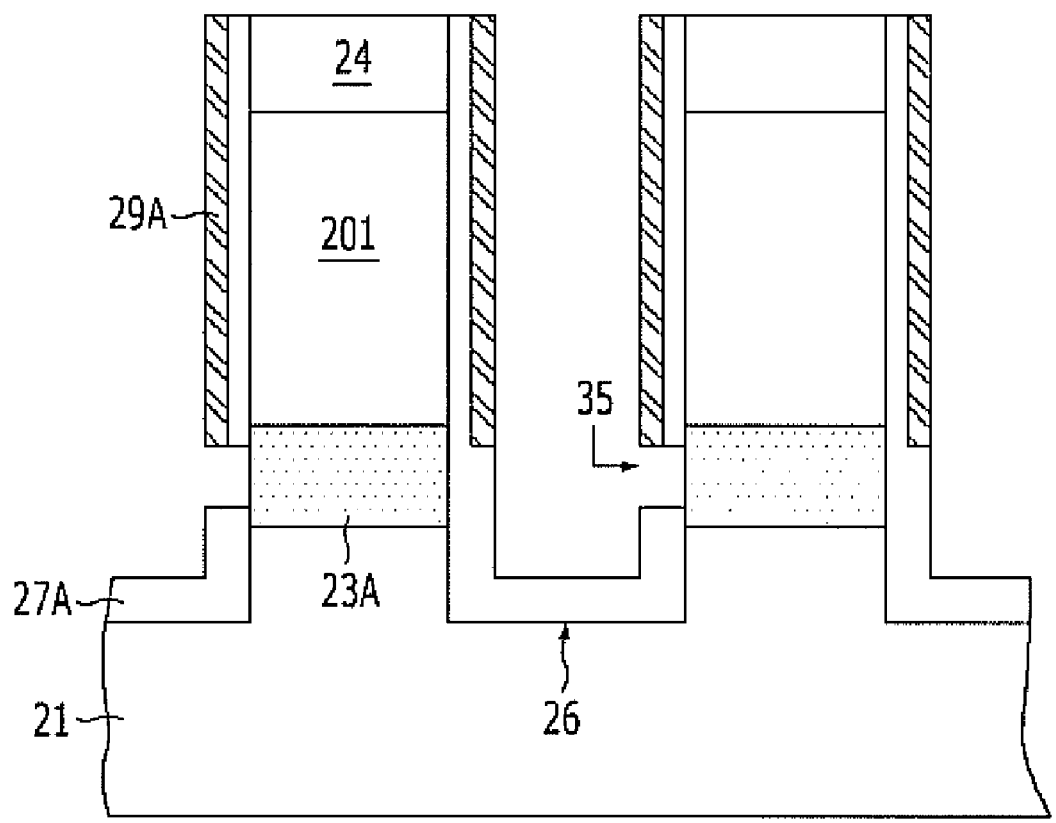

Referring to FIG. 4K, the first spacer 30A and the doped etch barrier 32A are removed. When the doped etch barrier 32A is removed, the first gap-fill layer pattern 28B forming the second recess R2, is simultaneously removed as well.

FIGS. 5A to 5E are cross-sectional views illustrating a semiconductor device fabrication method after the formation of buried bit lines. FIGS. 5A to 5E present cross-sectional views obtained by cutting the semiconductor device along lines B-B' and C-C' shown in FIG. 3G which run perpendicular to the page of FIG. 3.

Figure 5A:
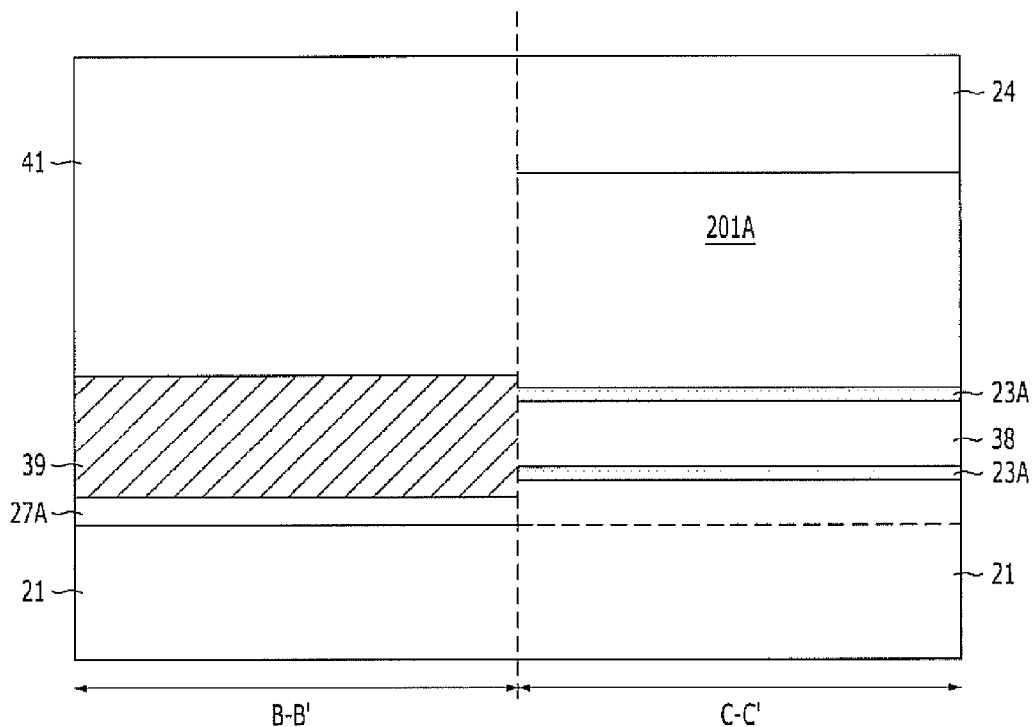
FIGS. 5A to 5E are cross-sectional views illustrating a semiconductor device fabrication method after the formation of buried bit lines.

Referring to FIG. 5A, a first inter-layer dielectric layer 41 is formed. The first inter-layer dielectric layer 41 is planarized until the surface of the hard mask pattern 24 is exposed.

Figure 5B:
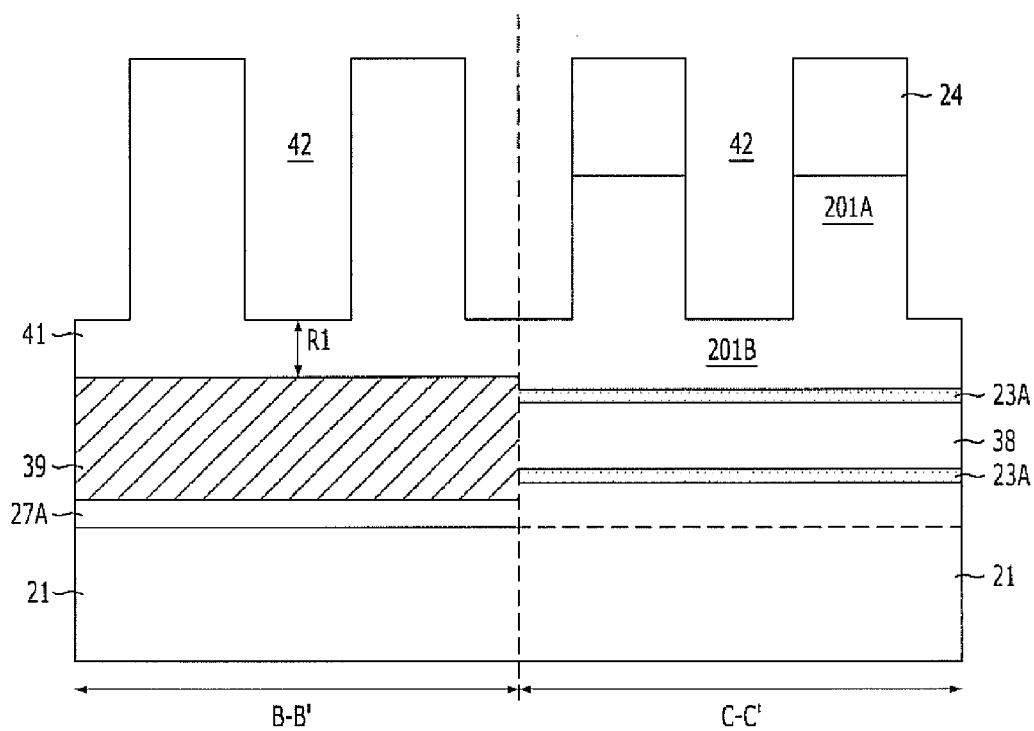

Referring to FIG. 5B, word line trenches 42 are formed. A photoresist layer pattern, which is not illustrated in the drawing, is used to form the word line trenches 42. After forming the photoresist pattern, the first inter-layer dielectric layer 41 is etched to a desired depth by using the photoresist pattern as an etch barrier. When the first inter-layer dielectric layer 41 is etched, the hard mask pattern 24 and the bodies 201 are etched to a desired depth, too. As a result of the etch process, body pattern 201B and pillars 201A are formed. The body pattern 201B and the pillars 201A become active regions. The body pattern 201B is a portion where the sidewall junction 38 is formed, and it is formed in the shape of line extended in the same direction as the buried bit line 39 is laid. The pillars 201A are extended in a vertical direction over the body pattern 201B. The pillars 201A are formed on a cell basis. The remaining thickness R1 of the first inter-layer dielectric layer 41 functions as an isolation layer between the buried bit line 39 and the vertical word line.

Figure 5C:
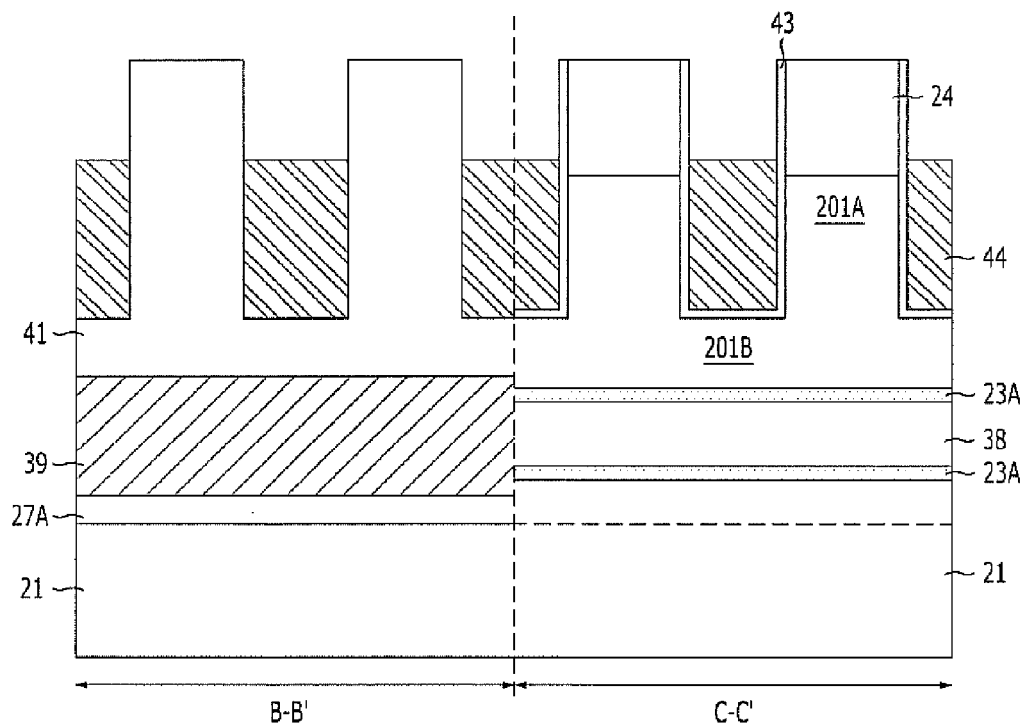

Referring to FIG. 5C, a word line conductive layer 44 is formed to gap-fill the word line trenches (refer to the reference numeral '42' of FIG. 5B). Subsequently, a planarization process and an etch-back process are performed so that the word line conductive layer 44 remains at a desired height to gap-fill a portion of each word line trench 42. A gate insulation layer 43 is formed before the word line conductive layer 44 is formed.

Figure 5D:
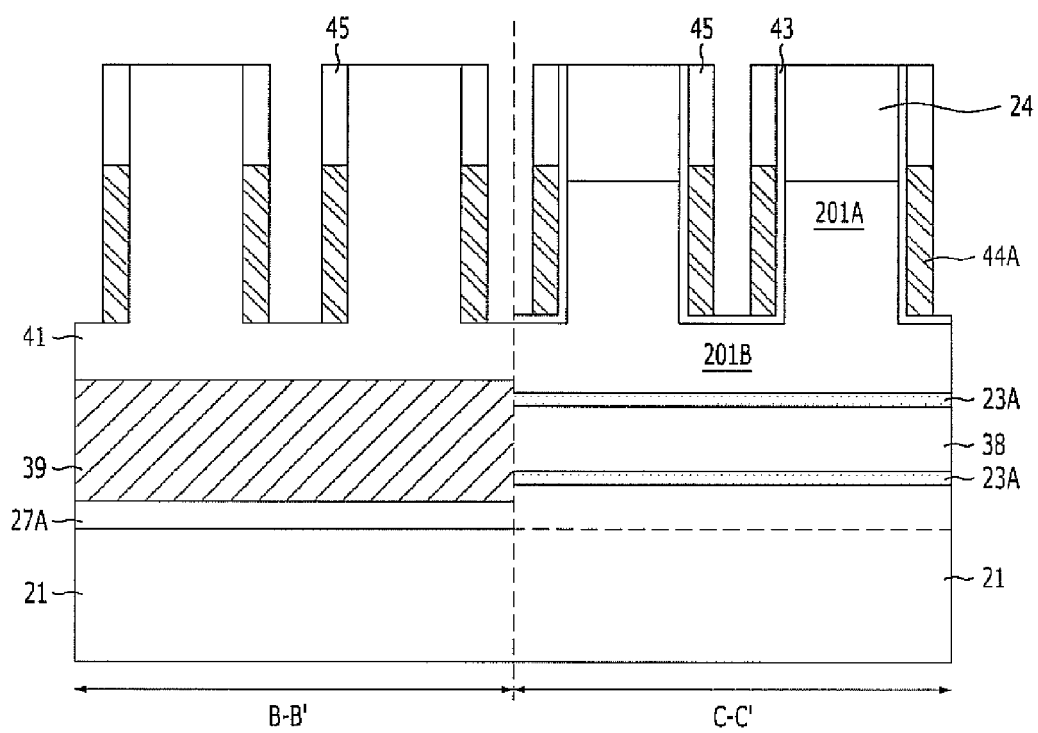

Referring to FIG. 5D, spacers 45 are formed by depositing a nitride layer and then performing an etch-back process on the nitride layer. The word line conductive layer 44 is etched by using the spacers 45 that are etched to form a spacer pattern. As a result, vertical word lines 44A each of which is adjacent to the sidewalls of a corresponding pillar 201A is formed. Here, the vertical word lines 44A also function as vertical gates, too. According to another exemplary embodiment of the present invention, after the circular vertical gates that each surround a corresponding pillar 201A are formed, vertical word lines 44A coupling adjacent vertical gates may be formed. The vertical word lines 44A are formed in a direction crossing the buried bit lines 39.

Figure 5E:
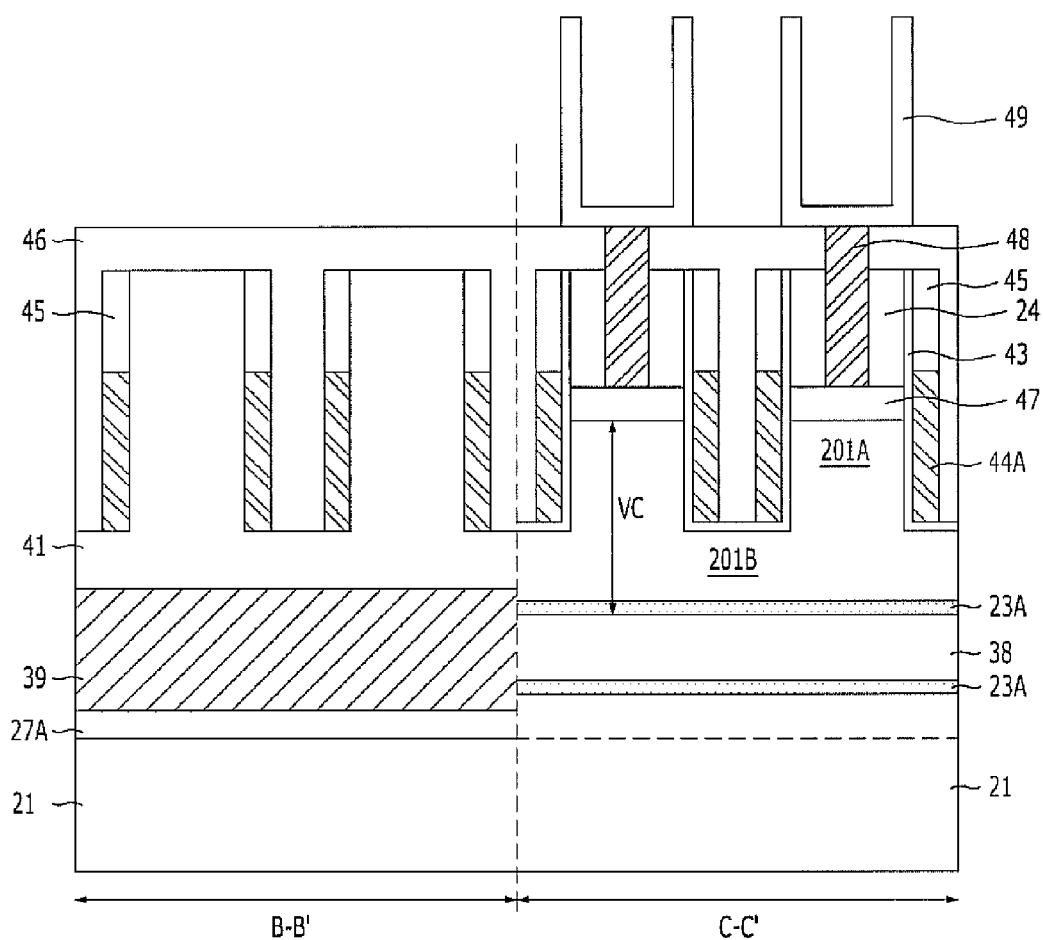

Referring to FIG. 5E, a second inter-layer dielectric layer 46 is formed over the resulting substrate structure including the vertical word lines 44A.

The upper portion of each pillar 201A is exposed by performing a storage node contact etch process. Subsequently, storage node contact plugs (SNC) 48 are formed. Before the storage node contact plugs 48 are formed, drains 47 may be formed by performing an ion-implantation. As a result, the drains 47, the sidewall junctions 38, and the vertical word lines 44A constitute a vertical channel transistor. The vertical word lines 44A form vertical channels between the drains 47 and the sidewall junctions 38. The sidewall junctions 38 become the source for vertical transistors.

Storage nodes 49 are formed over the storage node contact plugs 48. The storage nodes 49 may have a cylindrical shape. According to another exemplary embodiment of the present invention, the storage nodes 49 may have a pillar shape or a concave shape. Subsequently, a dielectric layer and an upper electrode are formed.

Exemplary embodiments of the present invention may prevent a floating body from being generated by forming a diffusion barrier region in advance in a region where a sidewall junction is to be formed and suppressing excessive diffusion of the sidewall junction.

While the present invention has been described with respect to exemplary embodiments, it will be apparent to those skilled in the art that various changes and modifications may be made without departing from the spirit and scope of the invention as defined in the following claims.

What is claimed is:

1. A method for fabricating a semiconductor device, comprising:
   forming a plurality of bodies that are each isolated from another by a trench and each include a diffusion barrier region with a sidewall exposed to the trench;
   forming a doped layer gap-filling the trench; forming a sidewall junction at the exposed sidewall of the diffusion barrier region by annealing the doped layer; and
   forming a conductive line coupled with the sidewall junction to fill the trench,
   wherein the diffusion barrier region comprises an interstitial impurity.

2. The method of claim 1, wherein the forming the plurality of bodies comprises:
   forming the diffusion barrier region by performing an ion implantation process on a substrate; and
   forming the trench by etching the substrate to a depth below the diffusion barrier region.

3. The method of claim 1, wherein the forming the plurality of bodies comprises:
   forming the diffusion barrier region by performing an ion implantation process on a substrate, wherein the ion implantation process includes implanting the interstitial impurity into the diffusion barrier region to suppress diffusion of a dopant from the doped layer into the diffusion barrier region in the annealing of the doped layer.

4. The method of claim 1, wherein the interstitial impurity comprises carbon.

5. The method of claim 1, wherein the doped layer comprises a doped polysilicon layer.

6. The method of claim 1, wherein the doped layer comprises a polysilicon layer doped with phosphorus (P).

7. The method of claim 1, further comprising: forming an insulation layer having a sidewall contact after the forming the plurality of the bodies to expose a sidewall of the diffusion barrier region.

8. The method of claim 1, wherein the plurality of the bodies comprise silicon bodies and the conductive lines comprise metal bit lines.

9. The method of claim 3, wherein the dopant comprises phosphorus (P) and the interstitial impurity comprises carbon.

10. A method for fabricating a semiconductor device, comprising:
    forming a diffusion barrier layer by performing an ion implantation process on a substrate;
    forming a plurality of bodies that are each isolated from another by a trench and each include a diffusion barrier region of the diffusion barrier layer with a sidewall of the diffusion barrier region being exposed to the trench by etching the substrate to a depth below the diffusion barrier region;
    forming an insulation layer through which a sidewall contact is formed to expose the sidewall of the diffusion barrier region;
    forming a doped layer gap-filling the trench; forming a sidewall junction at the exposed sidewall of the diffusion barrier region by annealing the doped layer; and
    forming a buried bit line coupled with the sidewall junction to fill a portion of the trench,
    wherein in the forming of the diffusion barrier layer, an interstitial impurity is ion-implanted into the substrate.

11. The method of claim 10, further comprising: forming a plurality of pillars by etching an upper portion of each body after the forming the buried bit line; and forming a vertical word line extending along the sidewalls of the pillars in a direction crossing the buried bit line.

12. The method of claim 10, wherein the interstitial impurity comprises carbon.

13. The method of claim 10, wherein the doped layer comprises a doped polysilicon layer.

14. The method of claim 10, wherein the doped layer comprises a polysilicon layer doped with phosphorus (P).

15. The method of claim 10, wherein the plurality of the bodies comprise silicon bodies.

* * * * *